(12) United States Patent
Uraguchi et al.

(10) Patent No.: US 6,528,425 B1
(45) Date of Patent: *Mar. 4, 2003

(54) METHOD AND APPARATUS FOR PROCESSING SUBSTRATE SURFACE WITH STRIPED RIDGE PATTERNS

(75) Inventors: Masahiro Uraguchi, Kawasaki (JP); Mitsugu Uemura, Kawasaki (JP); Ryuji Maeda, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/997,556

(22) Filed: Dec. 23, 1997

(30) Foreign Application Priority Data

Dec. 26, 1996  (JP) ............................................. 8-349088

(51) Int. Cl.$^7$ ............................................. H01L 21/302
(52) U.S. Cl. ...................... 438/689; 438/745; 438/747; 438/748; 438/750
(58) Field of Search ........................... 427/475; 141/70; 438/913, 928, 689, 745, 747, 748, 749, 750

(56) References Cited

U.S. PATENT DOCUMENTS

| | | | | |
|---|---|---|---|---|
| 4,832,759 A | * | 5/1989 | Curtis et al. | 435/305.1 |
| 5,083,226 A | * | 1/1992 | Shiiki et al. | 360/77.05 |
| 5,171,996 A | * | 12/1992 | Perez-Mendez | 250/361 R |
| 5,266,141 A | * | 11/1993 | Seailles et al. | 156/230 |
| 5,372,312 A | * | 12/1994 | Vidusek | 239/419.3 |
| 5,419,733 A | * | 5/1995 | Johnson et al. | 451/39 |
| 5,498,444 A | * | 3/1996 | Hayes | 427/162 |
| 5,529,829 A | * | 6/1996 | Koskenmaki et al. | 428/167 |
| 5,730,637 A | * | 3/1998 | Suzuki et al. | 445/49 |
| 5,760,502 A | * | 6/1998 | Van Loenen et al. | 310/42 |

* cited by examiner

Primary Examiner—Benjamin L. Utech
Assistant Examiner—V. Perez-Ramos
(74) Attorney, Agent, or Firm—Armstrong, Westerman & Hattori, LLP

(57) ABSTRACT

A substrate with striped ridge patterns formed on the surface thereof is transported along a transport path. A relationship is determined between the direction of the striped ridge patterns on the substrate surface and the direction of jetting out fluid to the substrate surface. The fluid is jetted out and blown to the substrate surface along the direction satisfying the determined relationship to process the surface of the substrate. It is possible to reliably perform a surface process of each substrate irrespective of different directions of striped ridge patterns on substrate surfaces.

13 Claims, 7 Drawing Sheets

METHOD AND APPARATUS FOR PROCESSING SUBSTRATE SURFACE WITH STRIPED RIDGE PATTERNS

BACKGROUND OF THE INVENTION a) Field of the Invention

The present invention relates to a method and apparatus for processing a substrate and, more particularly, to a substrate processing method and apparatus suitable for processing a substrate having striped ridge patterns on the surface thereof.

b) Description of the Related Art

When the surface of a large substrate having a side length of 300 mm or longer, such as a liquid crystal panel and a plasma display panel (PDP), is wet processed, the substrate is generally transported in one direction during which liquid chemicals are supplied on the substrate surface. Also during a dry process, the substrate is transported in one direction during which gas is blown from an air knife to dry the substrate surface.

The direction of a gas flow jetted out of the air knife is maintained fixed. For example, a vector obtained by vertically projecting the direction of a gas flow upon the substrate surface is slightly slanted from a direction parallel to the transport direction of the substrate. With such a layout, liquid chemicals can be efficiently blown to dry the substrate surface, if the substrate surface has striped ridge patterns parallel to the transport direction.

However, if the substrate surface has striped ridge patterns perpendicular to the transport direction, raised portions of the ridge patterns hinder liquid chemicals from being efficiently blown so that it becomes difficult to dry the substrate surface. Liquid chemicals may be left on the ridge patterns where gas is not directly blown. If the left liquid chemicals dry thereafter, impurities in the chemicals adhere to the substrate surface and may cause defectiveness.

SUMMARY OF THE INVENTION

It is an object of the present invention to provide a method and apparatus of processing a substrate, capable of efficiently processing the substrate independently from how striped ridge patterns are formed on the substrate surface.

According to one aspect of the present invention, there is provided a substrate processing method comprising the steps of: (a) transporting a substrate along a transport path, the substrate having striped ridge patterns formed on the surface thereof; (b) determining a relationship between the direction of the striped ridge patterns formed on the surface of the substrate and the direction of jetting out and blowing fluid to the substrate; and (c) jetting out the fluid to the surface of the substrate along the direction satisfying the relationship determined at the step (b) and processing the surface of the substrate.

Since the direction of jetting out fluid is determined in accordance with the direction of striped ridge patterns, fluid can be blown to the substrate surface in a direction suitable for this substrate. It is therefore possible to reliably perform a substrate surface process.

According to another aspect of the present invention, there is provided a substrate processing apparatus comprising: a transport path for transporting a substrate to be processed; first and second jetting units having different directions of jetting out fluid from each other, the first and second jetting units processing the surface of the substrate being transported along the transport path by jetting out the fluid to the surface of the substrate; and control unit for selecting one of the first and second jetting units in accordance with the direction of striped ridge patterns formed on the surface of the substrate being transported along the transport path, and for jetting out the fluid from the selected jetting unit.

Since jetting unit suitable for particular striped ridge patterns can be selected, fluid can be blown to the substrate surface in a direction suitable for this substrate.

According to a further aspect of the present invention, there is provided a substrate processing apparatus comprising: a transport path for transporting a substrate to be processed; jetting unit capable of changing the direction of jetting out fluid, the jetting unit processing the surface of the substrate by blowing the fluid to the surface of the substrate being transported along the transport path; and control unit for changing the jetting direction of the jetting unit in accordance with the direction of striped ridge patterns formed on the surface of the substrate being transported along the transport path.

Since fluid can be blown to the substrate surface in a direction suitable for the direction of striped ridge patterns, a proper surface process can be performed for each substrate.

According to a still further aspect of the present invention, there is provided a substrate processing apparatus comprising: a first transport path for transporting a substrate to be processed; a second transport path connected to the first transport path; substrate rotating means mounted at a connection point between the first transport path and the second transport path, the substrate rotating means being capable of receiving the substrate transported from the first transport path, rotating the substrate in a substrate plane, and sending the substrate to the second transport path; and jetting unit for jetting out fluid to the surface of the substrate being transported along the second transport path and processing the surface of the substrate.

It is possible to blow fluid in a direction suitable for each substrate by changing the direction of the substrate.

According to another aspect of the present invention, there is provided a substrate processing apparatus comprising: an inflow transport path for transporting a substrate to be processed; first and second outflow transport paths connected to the first inflow transport path; branching means mounted at a connection point between the inflow transport path and the first and second outflow transport paths, the branching means receiving the substrate transported from the inflow transport path and sending the substrate to one of the first and second outflow transport paths; and first and second jetting units for jetting out fluid to the surface of the substrate being transported respectively along the first and second outflow transport paths and processing the surface of the substrate.

The outflow transport path suitable for the direction of striped ridge patterns on the substrate surface is selected so that it is possible to blow fluid to the substrate surface in a direction suitable for this substrate at each outflow transport path.

According to still another aspect of the present invention, there is provided a substrate processing method comprising the steps of: (a) transporting a substrate along a transport path, the substrate having striped ridge patterns formed on the surface thereof; (b) determining the direction of scanning the surface of the substrate, in accordance with the direction of the striped ridge patterns formed on the surface of the substrate; and (c) changing the direction of jetting out fluid while the fluid is blown to the surface of the substrate, so that a flow of the fluid scans the surface of the substrate in the scanning direction determined by the step (b).

The surface of a substrate can be scanned with a flow of fluid in a direction suitable for this substrate. It is therefore possible to perform a proper surface process.

According to a further aspect of the present invention, there is provided a substrate processing apparatus comprising: a transport path for transporting a substrate to be processed; first jetting unit for jetting out fluid to the surface of the substrate being transported along the transport path, the first jetting unit being capable of making a flow of the fluid jetted out of the first jetting unit scan the surface of the substrate in a first direction; and second jetting unit for jetting out fluid to the surface of the substrate being transported along the transport path, the second jetting unit being capable of making a flow of the fluid jetted out of the second jetting unit scan the surface of the substrate in a second direction different from the first direction.

The surface of a substrate can be scanned with a flow of fluid in a direction suitable for this substrate. It is therefore possible to perform a proper surface process.

As above, it is possible to blow fluid in a direction suitable for particular striped ridge patterns on the substrate surface. The substrate surface can therefore be processed efficiently.

DETAILED DESCRIPTION OF THE PREFERRED EMBODIMENTS

Figure 1A:
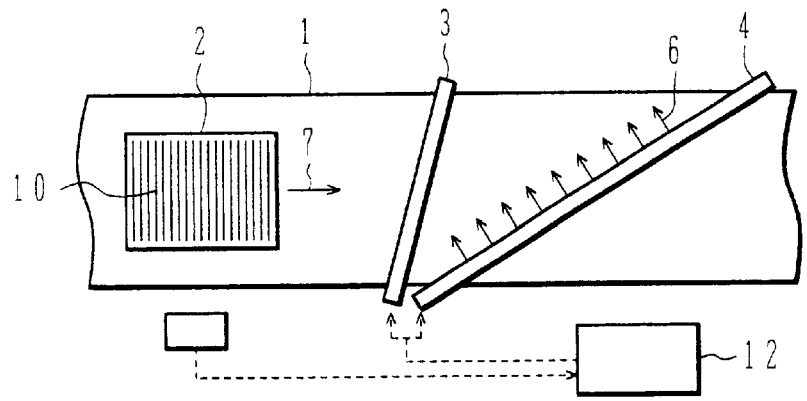
FIGS. 1A to 1C are plan views showing the outline of substrate processing apparatuses according to a first embodiment of the invention.
Figure 1B:
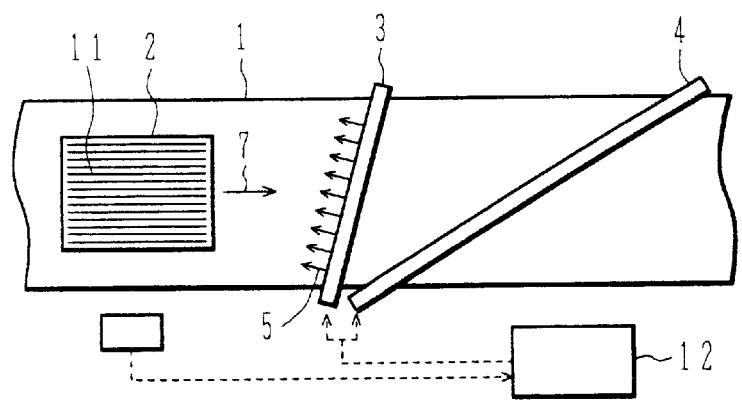

FIGS. 1A and 1B are schematic plan views showing a substrate processing apparatus according to the first embodiment of the invention.

As shown in FIGS. 1A and 1B, a substrate 2 is placed on the surface of a transport path 1. The transport path 1 transports the substrate 2 to the right as indicated by an arrow 7. For example, the transport path 1 may be constructed by a plurality of rollers disposed at a constant interval.

Air knives 3 and 4 are disposed riding over the transport path 1. Pressured gas such as dry air or nitrogen gas is supplied from a controller 12 to the air knives 3 and 4. Slits are formed in the air knives 3 and 4 along their longitudinal direction, gas being jetted out through these slits. Gas jetted out of the slit forms a gas curtain flow and brown to the surface of the substrate 2 transported by the transport path 1. The controller 12 detects the direction of striped ridge patterns formed on the surface of the substrate 2 being transported along the transport path 1, and supplies gas to one or both of the air knives 3 and 4 in accordance with the detection results. The width of the slit formed in each of the air knives 3 and 4 is, for example, about 0.5 mm, and the gas supplied to the air knives 3 and 4 raises its pressure to about 1 kgf or lower.

As shown in FIG. 1B, a vector 5 obtained by vertically projecting the direction of a gas flow jetted out of the air knife 3 upon a virtual plane inclusive of the surface of the substrate 2 has an angle larger than 135° and smaller than 180° relative to a vector 7 representing the transport direction of the substrate 2. As shown in FIG. 1A, a vector 6 obtained by vertically projecting the direction of a gas flow jetted out of the air knife 4 upon the virtual plane inclusive of the surface of the substrate 2 has an angle larger than 90° and smaller than 135° relative to the vector 7 representing the transport direction of the substrate 2.

Consider now striped ridge patterns formed on the surface of the substrate 2 transported along the transport path 1.

In FIG. 1A, striped ridge patterns perpendicular to the transport direction are formed on the surface of the substrate 2. The striped ridge patterns have a plurality of grooves 10 extending in the direction perpendicular to the transport direction. While the substrate 2 is transported along the transport path 1, the controller 12 makes gas jet out of the air knife 4.

The vector 6 obtained by vertically projecting the direction of the gas flow upon the virtual plane inclusive of the substrate surface intersects at an angle smaller than 45° with the longitudinal direction of the groove 10. If this intersection angle becomes near 90°, the inner wall of the groove is shaded by the raised portion of the ridge formed on the surface of the substrate 2 so that it becomes hard to blow liquid chemicals to the inner wall of the groove. In the example shown in FIG. 1A, gas is jetted out not from the air knife 3 but from the air knife 4. Therefore, the angle between the vector 6 and the longitudinal direction of the groove 10 is set smaller than 45° and liquid chemicals can be efficiently blown and the substrate surface can be dried efficiently.

In FIG. 1B, striped ridge patterns parallel to the transport direction are formed on the surface of the substrate 2. The striped ridge patterns have a plurality of grooves 11 extending in parallel to the transport direction. While the substrate 2 is transported along the transport path 1, the controller 12 makes gas jet out of the air knife 3. The vector 5 obtained by vertically projecting the gas flow upon the virtual plane inclusive of the substrate surface intersects at an angle smaller than 45° with the longitudinal direction of the groove 11.

Since the two air knives 3 and 4 having different gas flow directions from each other are used, a gas flow having a direction suitable for the direction of striped ridge patterns formed on the substrate 2 can be selected. By selecting one of the air knives capable of forming a gas flow suitable for the direction of striped ridge patterns and jetting gas from this selected air knife, liquid chemicals can always be removed efficiently and the substrate surface can be dried efficiently.

If the striped ridge patterns on the substrate surface are in parallel to the transport direction, this transport direction of the substrate may be reversed periodically while the substrate is exposed to the gas flow jetted out of the air knife. In this manner, the surface of the substrate can be dried more reliably.

In the examples of FIGS. 1A and 1B, two knives are used, the air knife 3 being used for the substrate formed with striped ridge patterns parallel to the transport direction and the air knife 4 being used for the substrate formed with striped ridge patterns perpendicular to the transport direction. Two knives may be provided for each of the two types of substrates.

Figure 1C:
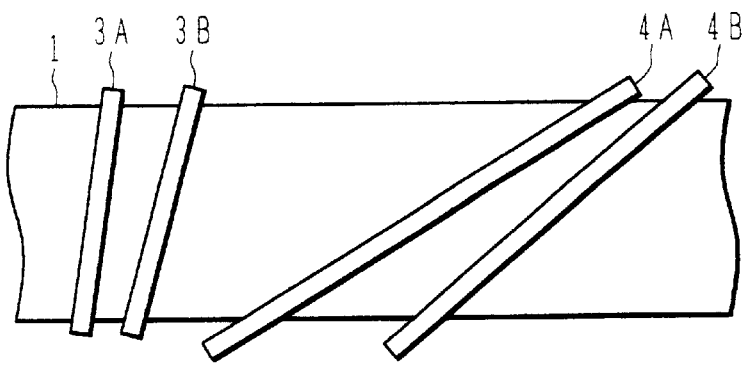

In the example shown in FIG. 1C, a pair of air knives 3A and 3B are provided in place of the air knife 3 and another pair of air knives 4A and 4B are provided in place of the air knife 4. In this example, it is preferable to set each pair of two air knives so that the vectors obtained by vertically projecting the directions of the gas flows from the two air knives upon the substrate surface are slightly different from each other.

Figure 2A:
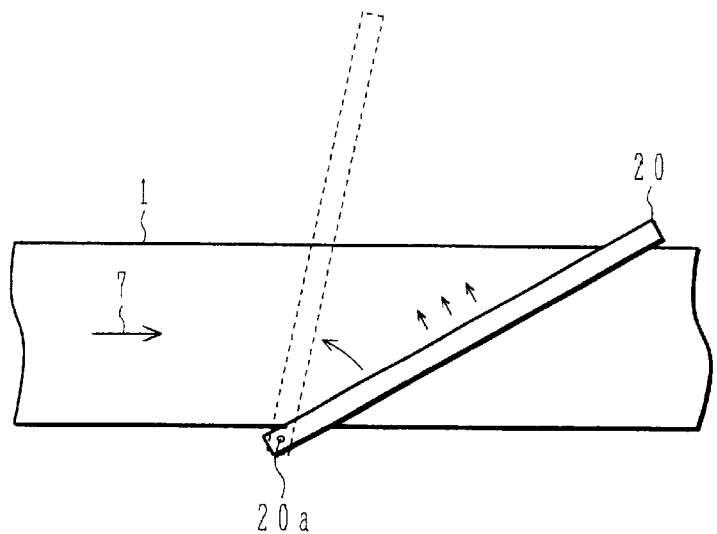
FIGS. 2A to 2C are plan views showing the outline of substrate processing apparatuses according to modifications of the first embodiment.
Figure 2B:
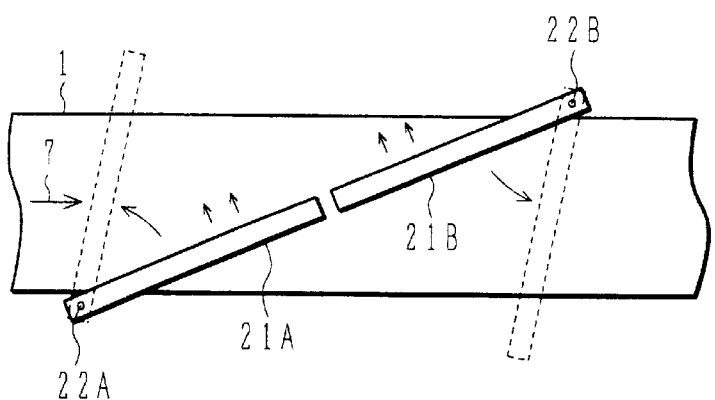
Figure 2C:
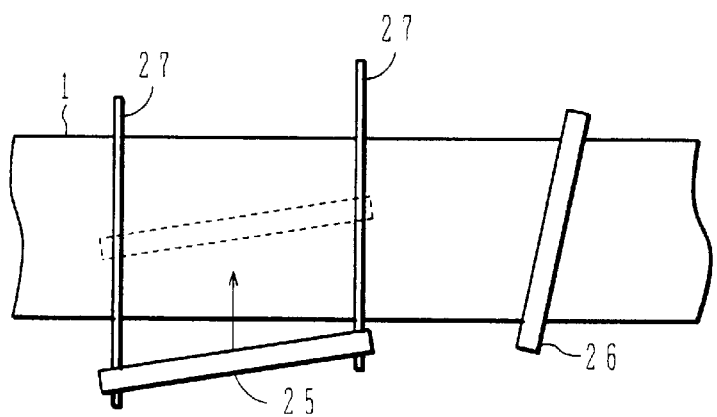

FIGS. 2A to 2C are plan views showing the outline of substrate processing apparatuses according to modifications of the first embodiment.

In the modification shown in FIG. 2A, a single air knife 20 is disposed riding over a transport path 1. The air knife 20 is rotatively supported at its one end by a support shaft 20a so that it can be rotated along a virtual plane parallel to the surface of the transport path 1.

By rotating the air knife 20, it is possible to change the intersection angle between the transport direction 7 and the vector obtained by vertically projecting a gas flow jetted out of the air knife 20 upon a virtual plane inclusive of the substrate surface. It is therefore possible to set the direction of the gas flow in a suitable range by rotating the air knife 20 in accordance with the direction of striped ridge patterns formed on the substrate surface.

In the modification shown in FIG. 2B, two air knives 21A and 21B are disposed in place of the air knife 20 shown in FIG. 2A. The air knife 21A is rotatively supported at its one end near the transport path 1 by a support shaft 22A, and the air knife 21B is rotatively supported at its one end near the opposite side of the transport path 1 by a support shaft 22B.

If the air knife 21A or 21B intersects with the transport path 1 at a deep angle (if an angle between the longitudinal direction of the air knife 21A or 21B and the transport direction is larger than 45° and smaller than 90°), the distal end of the air knife 21A or 21B extends farther than the side of the transport path 1 opposite to the support shaft 22A or 22B as shown by broken lines in FIG. 2B. Therefore, if the direction of striped ridge patterns on the substrate is parallel to the transport direction 7, the whole surface of the substrate can be efficiently dried by jetting gas only from one of the air knives 21A and 21B.

If the air knives 21A and 21B intersect with the transport path 1 at a shallow angle (if an angle between the longitudinal direction of the air knife 21A or 21B and the transport direction is larger than 0° and smaller than 45°), the distal ends of the air knives 21A and 21B position approximately at the center of the transport path 1 as shown by solid lines in FIG. 2B. Gas can be brown to the area corresponding to the whole width of the transport path 1 by using the two air knives 21A and 21B. If the direction of striped ridge patterns on the substrate is perpendicular to the transport direction 7, the air knives 21A and 21B are rotated so as to make the longitudinal direction of the knives intersect at the shallow angle with the transport direction, and gas is jetted out of both the air knives 21A and 21B. By jetting out gas from the two air knives 21A and 21B, the whole surface of the substrate can be efficiently dried.

As compared to the modification shown in FIG. 2A, the air knives of the modification shown in FIG. 2B are shorter. Therefore, even if the longitudinal direction of the air knives intersects at a deep angle with the transport direction, it is not necessary to reserve a large space for accommodating the distal end portions of the air knives.

The modification shown in FIG. 2C uses an air knife 25 intersecting at a shallow angle with the transport path 1 and an air knife 26 intersecting at a deep angle. The air knife 25 is supported by two rails 27 riding over the transport path 1 to allow the air knife 25 to have a translational motion on the rails 27. While gas is jetted out of the air knife 25, the air knife 25 is moved from one side to the opposite side of the transport path 1 so that gas can be brown to the area corresponding to the whole width of the transport path 1.

The air knife 26 has the same structure as that of the air knife 3 shown in FIGS. 1A and 1B. Also in the modification shown in FIG. 2C, the air knives 25 and 26 are selectively used so that the substrate surface can be efficiently dried independently from the direction of striped ridge patterns on the substrate surface.

Next, a substrate processing apparatus according to the third embodiment of the invention will be described with reference to FIGS. 3A to 3D.

Figure 3A:
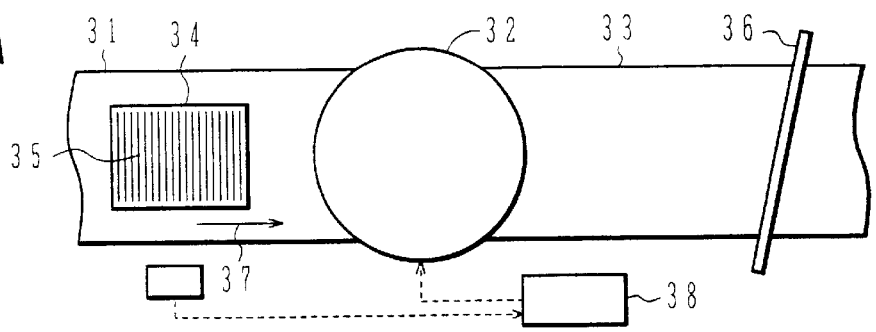
FIGS. 3A to 3D are plan views showing the outline of a substrate processing apparatus according to a second embodiment of the invention.

As shown in FIG. 3A, a first transport path 31 and a second transport path 33 are coupled by a substrate rotating mechanism 32 interposed therebetween. Under the control of a controller 38, the substrate rotating mechanism 32 can rotate a substrate placed thereon. The controller 38 detects the direction of striped ridge patterns formed on the surface of a substrate 34 being transported along the first transport path 31, and drives the substrate rotating mechanism 32 in accordance with the detection results. At the downstream side of the second transport path 33, an air knife 36 similar to the air knife 3 shown in FIGS. 1A and 1B is disposed. The substrate 34 is transported along the first transport path 31 to the right as indicated by an arrow 37. Striped ridge patterns 35 perpendicular to the transport path 37 are formed on the surface of the substrate 34.

Figure 3B:
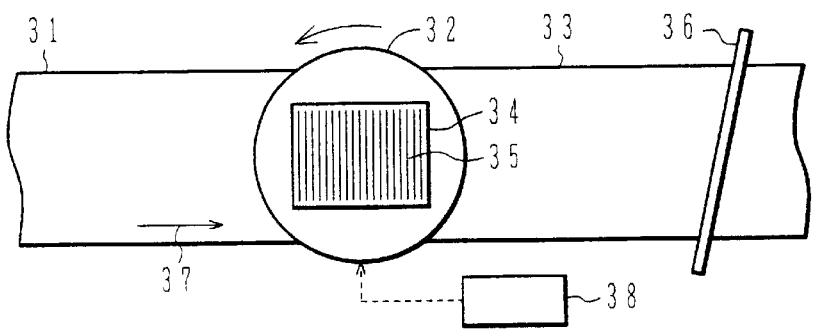

As shown in FIG. 3B, the substrate 34 is transported to the central area of the substrate rotating mechanism 32. The mechanism 32 is rotated to make the direction of the striped ridge patterns 35 parallel to the transport direction 37. In the case of FIG. 3B, the substrate rotating mechanism 32 is rotated by 90°. The structure of the substrate rotating mechanism 32 will be later described with reference to FIGS. 4A to 4E.

Figure 3C:
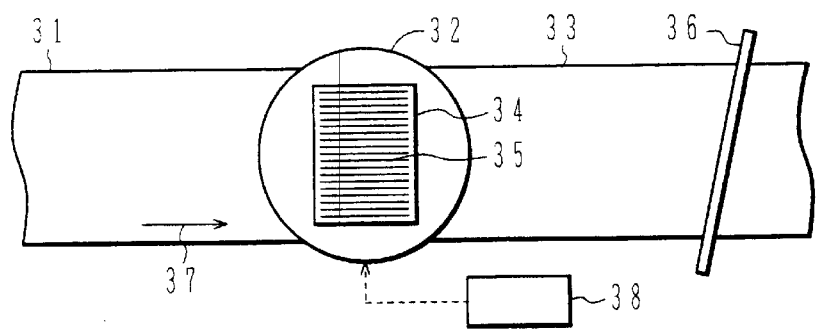

FIG. 3C shows the state after the substrate rotating mechanism 32 was rotated. In this state, the direction of the striped ridge patterns formed on the surface of the substrate becomes parallel to the transport direction 37.

Figure 3D:
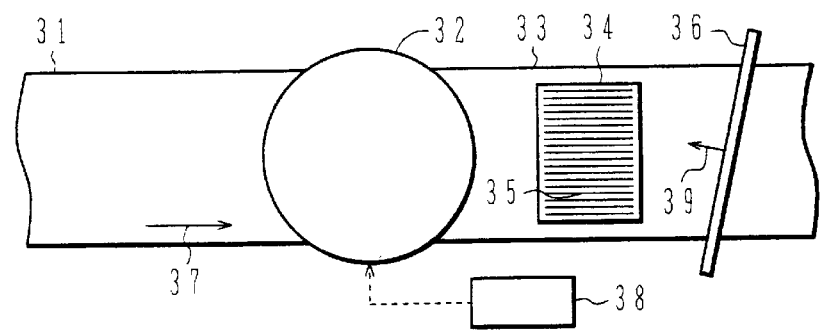

Thereafter, as shown in FIG. 3D, the substrate 34 is made to ride on the second transport path 33 and transported along the second transport path 33. Gas is jetted out of the air knife 36 in the direction indicated by an arrow 39 to dry the surface of the substrate 34. In this case, an angle between the vector obtained by vertically projecting a gas flow upon a virtual plane inclusive of the substrate surface and the direction of striped ridge patterns 35 is set smaller than 45°. Therefore, the substrate surface can be efficiently dried.

If the direction of striped ridge patterns on the surface of a substrate transported along the first transport path 31 is parallel to the transport direction 37, the substrate is moved to the second transport path 33 without rotating it with the substrate rotating mechanism 32. Also in this case, an angle between the image obtained by vertically projecting the direction of a gas flow upon the virtual plane inclusive of the substrate surface and the direction of striped ridge patterns 35 is set smaller than 45°. Therefore, the substrate surface can be efficiently dried.

As above, the substrate surface can always be dried efficiently by rotating the substrate in accordance with the direction of striped ridge patterns on the substrate surface transported along the first transport path 31.

Next, an example of a method of rotating the substrate 34 with the substrate rotating mechanism 32 will be described with reference to FIGS. 4A to 4E which are front views of the substrate processing apparatus shown in FIGS. 3A to 3D.

Figure 4A:
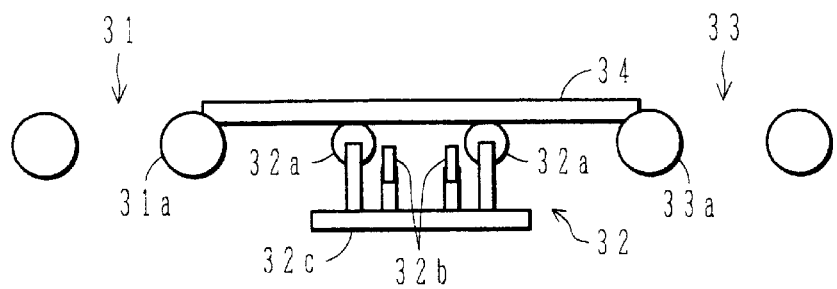
FIGS. 4A to 4E are front views briefly showing an example of a substrate rotating mechanism of the substrate processing apparatus of the second embodiment.

As shown in FIG. 4A, the first transport path 31 and second transport path 33 are constructed by a plurality of rollers 31a and 33a. The substrate rotating mechanism 32 is positioned between the first and second transport paths 31 and 33. The substrate rotating mechanism 32 includes first and second rollers 32a and 32b having rotary axes perpendicular to each other. The first and second rollers 32a and 32b each include at least three rollers so as to stably support the substrate. The first and second rollers 32a and 32b are mounted on a base 32c and can be raised or lowered relative to the base 32c. In FIG. 4A, the first rollers 32a are aligned with the transport direction of the first and second transport paths 31 and 33.

The substrate 34 is transported from the first transport path 31 to the first roller 32a of the substrate rotating mechanism 32, and supported by the first rollers 32a. At this time, the second rollers are positioned lower than the first rollers 32a.

Figure 4B:
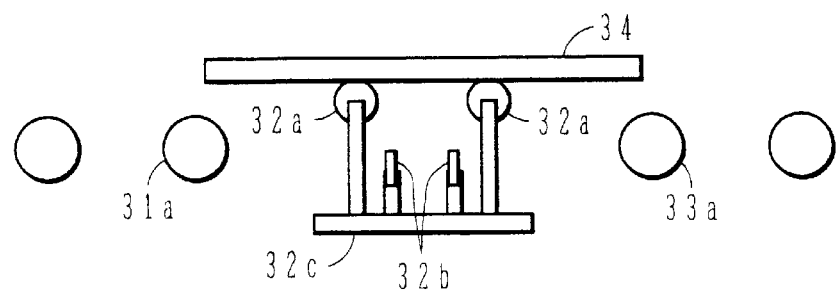
Figure 4C:
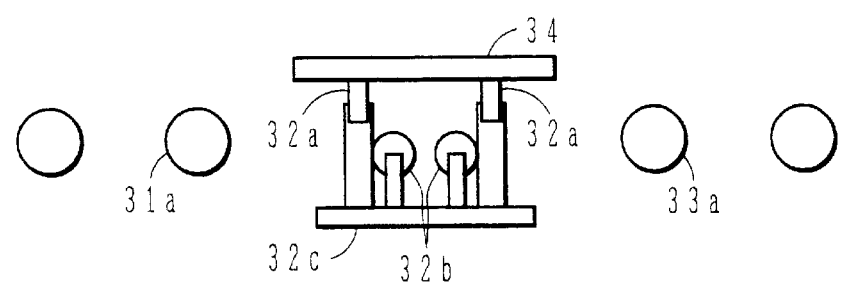

As shown in FIG. 4B, the first rollers 32a are lift to raise the substrate 34. In this state, the base 32c is rotated by 90°. FIG. 4C shows the state after the base 32c was rotated. In this state, the second rollers 32b are aligned with the transport direction.

Figure 4D:
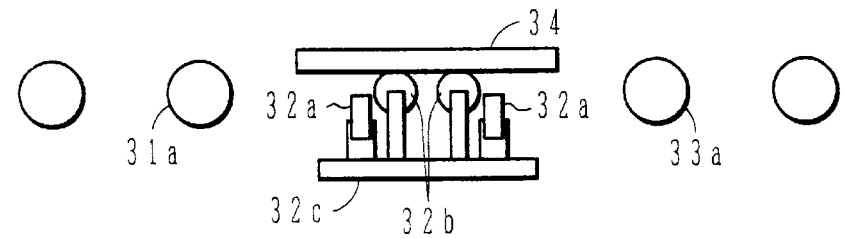
Figure 4E:
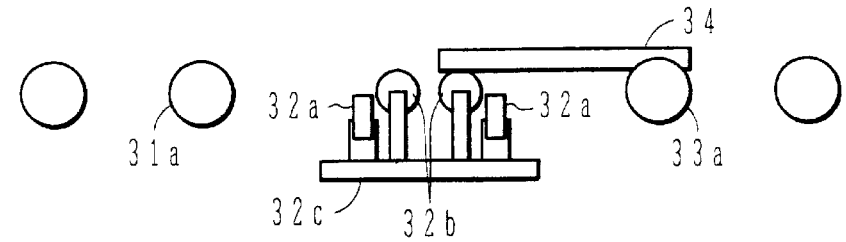

As shown in FIG. 4D, the second rollers 32b are lift to make the height of the second rollers 32b flush with the height of the first and second transport paths 31 and 33. Thereafter, the first rollers 32a are lowered. The substrate is held by the second rollers 32b at the height flush with the height of the rollers 33a of the second transport path 33. The second rollers 32b are then driven to transport the substrate 34 to the second transport path 33. In the above manner, the substrate 34 is rotated by 90° when it is transferred from the first transport path 31 to the second transport path 34.

Figure 5:
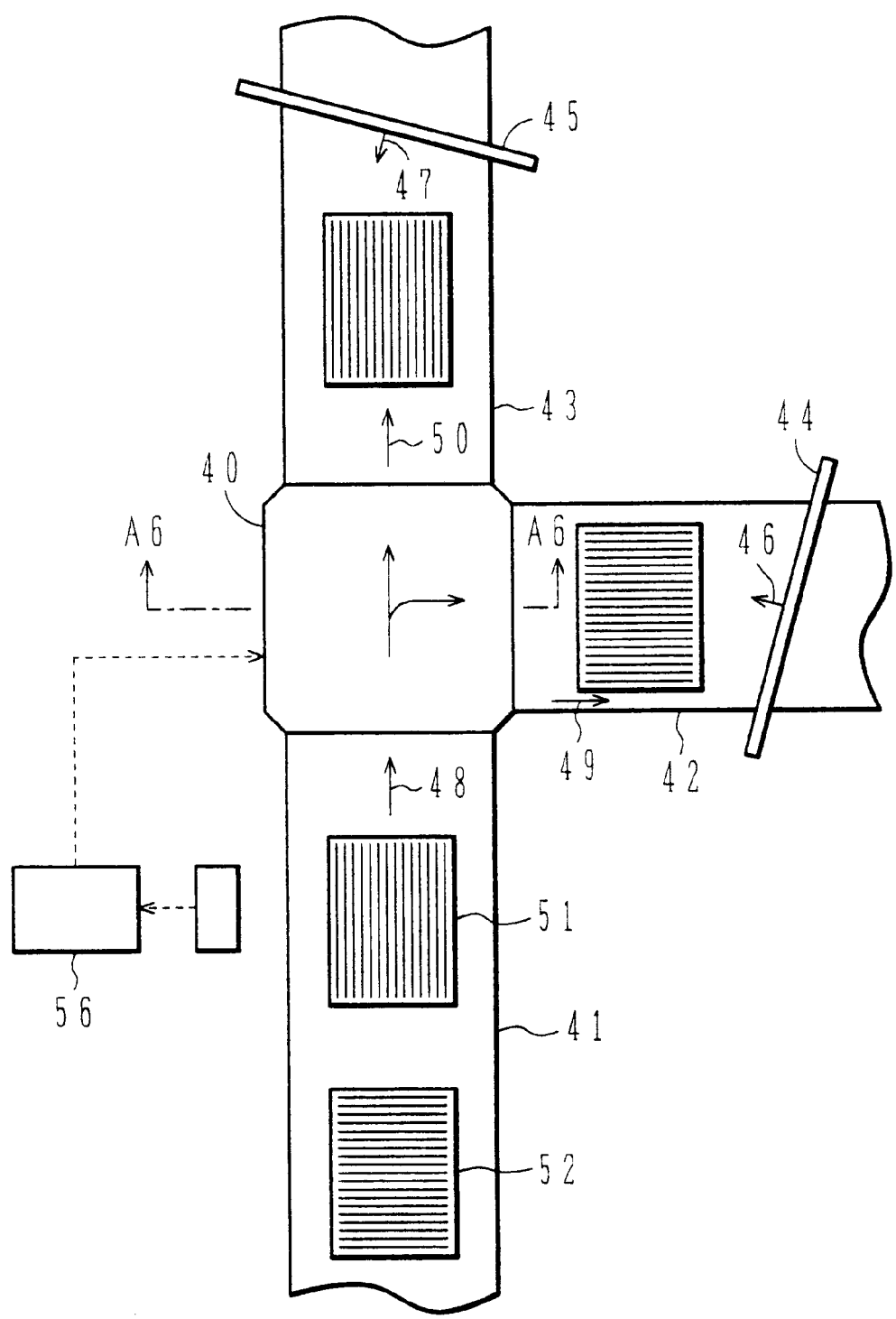
FIG. 5 is a plan view showing an outline of a substrate processing apparatus according to a third embodiment of the invention.

FIG. 5 is a schematic plan view of a substrate processing apparatus according to the third embodiment of the invention. An outflow end of an inflow transport path 41 is coupled via a branching mechanism 40 to inflow ends of first and second outflow transport paths 42 and 43. The transport direction 50 of the second outflow transport path 43 is the same as the transport direction 48 of the inflow transport path 41, whereas the transport direction 49 of the first outflow transport path 42 is perpendicular to the transport path 48 of the inflow transport path 41. The branching mechanism 40 is controlled by a controller 56. The controller 56 detects the direction of striped ridge patterns formed on the surface of each of substrates 51 and 52 being transported along the inflow transport path 41, and controls the branching mechanism 40 in accordance with the detection results.

Air knives 44 and 45 are disposed over the first and second outflow transport paths 42 and 43, respectively. The air knife 44 is disposed so that an angle between the transport direction 49 of the first outflow transport path 42 and the vector 46 obtained by vertically projecting a gas flow upon the virtual plane inclusive of the substrate surface is larger than 135° and smaller than 180°. Similarly, the air knife 45 is disposed so that an angle between the transport direction 50 of the second outflow transport path 43 and the vector 47 obtained by vertically projecting a gas flow upon the virtual plane inclusive of the substrate surface is larger than 135° and smaller than 180°.

The substrates 51 and 52 to be processed are transported along the inflow transport path 41. Striped ridge patterns parallel to and perpendicular to the transport direction of the inflow transport path 41 are formed on the substrates 51 and 52, respectively. In the example shown in FIG. 5, striped ridge patterns parallel to the transport direction of the inflow transport 41 are formed on the surface of the substrate 51, whereas striped ridge patterns perpendicular to the transport direction of the inflow transport path 41 are formed on the surface of the substrate 52.

The branching mechanism 40 receives the substrate transported by the inflow transport path 41, and sends it out either to the first or second outflow transport path, in accordance with the direction of the striped ridge patterns on the substrate surface. If the direction of striped ridge patterns are parallel to the transport direction of the inflow transport path 41 (in the case of the substrate 51), the substrate is moved straight forward to the second outflow transport path 43. On the other hand, if the direction of striped ridge patterns are perpendicular to the transport direction of the inflow transport path 41 (in the case of the substrate 52), the substrate is moved out toward the first outflow transport path 42.

Since the branching mechanism 40 branches each substrate in accordance with the direction of striped ridge patterns on the substrate surface, the direction of the striped ridge patterns on the surface of the substrate transported along the first or second outflow transport paths is always maintained parallel to the outflow transport direction. Therefore, an angle between the image obtained by vertically projecting the direction of a gas flow upon the substrate surface and the direction of striped ridge patterns is always set larger than 0° and smaller than 45°. The substrate surface can therefore be dried efficiently similar to the first embodiment.

Figure 6A:
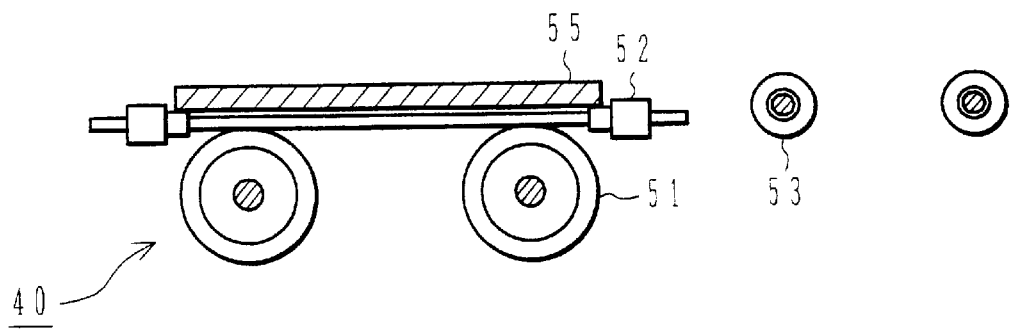
FIGS. 6A to 6C are cross sectional views briefly showing an example of a branching mechanism of the substrate processing apparatus of the third embodiment.
Figure 6B:
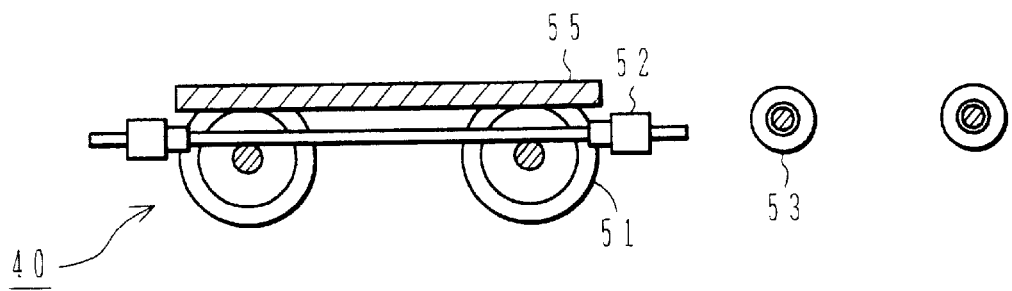
Figure 6C:
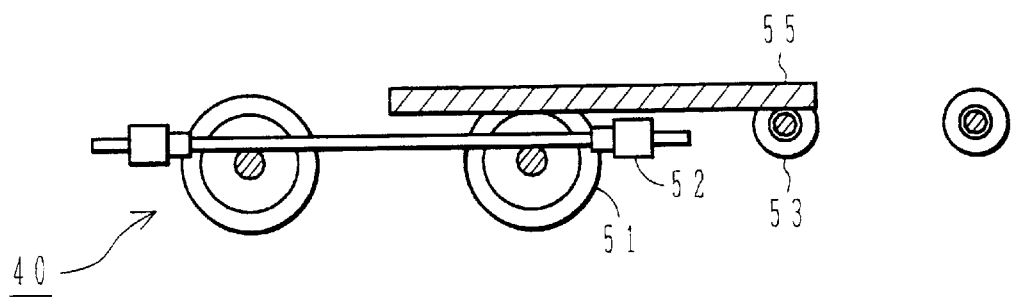

Next, with reference to FIGS. 6A to 6C, an example of the structure of the branching mechanism 40 shown in FIG. 5 and a branching method will be described. FIGS. 6A to 6c are cross sectional views taken along one-dot chain line A6—A6 of FIG. 5.

As shown in FIG. 6A, the branching mechanism 40 is constituted of first and second rollers 51 and 52. The first rollers 51 are aligned with the transport direction of the first outflow transport path, and the second rollers 52 are aligned with the transport direction of the inflow transport path and second outflow transport path. On the right side of the branching mechanism 40, rollers 53 of the first outflow transport path are disposed. A substrate transported along the inflow transport path (from the front side of the drawing sheet) is held by the second rollers 52. At this time, the first rollers 51 rest under the second rollers 52. If the substrate 55 is transported continuously with the same second rollers 52, it is sent to the second outflow transport path. In order to send the substrate 55 to the first outflow transport path, the transportation is temporarily suspended when the substrate 55 is held by the second rollers 52.

As shown in FIG. 6B, the first rollers 51 are lifted to hold the substrate 55. As shown in FIG. 6C, the first rollers 51 are driven to send the substrate 55 to the first outflow transport path 53. In this manner, the substrate 55 can be transported to the first outflow transport path.

In the above embodiments, gas is blown to the substrate surface to dry it. Instead of gas, liquid chemicals may be blown to the substrate surface to process it. Namely, the substrate surface may be processed by blowing any fluid such as air and liquid.

Next, with reference to FIG. 7, the fourth embodiment of the invention will be described. Although gas is blown to the substrate surface to dry it in the first and second embodiments, liquid chemicals are blown to the substrate surface in the fourth embodiment.

Figure 7:
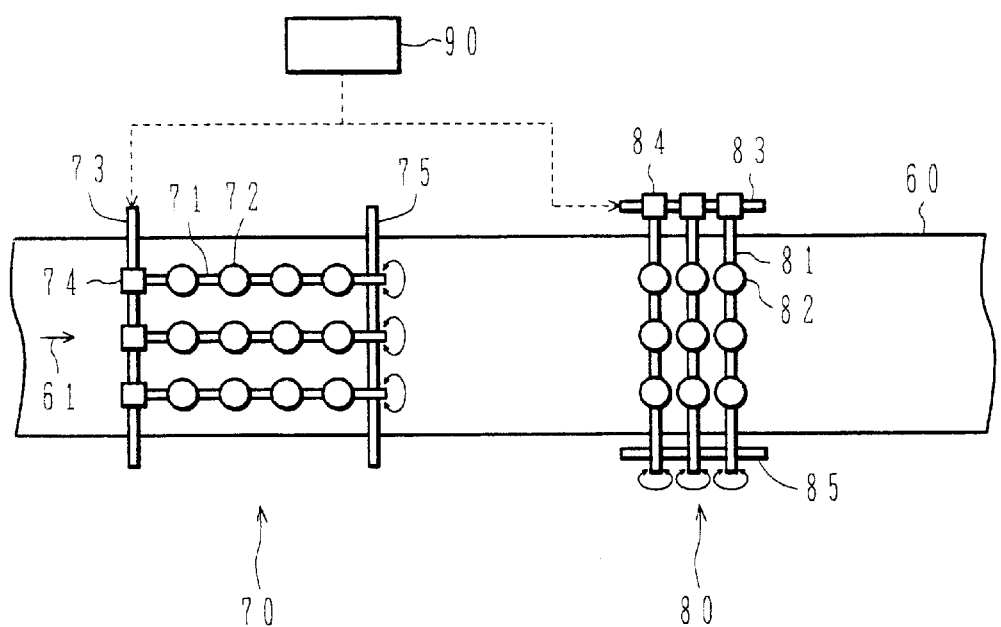
FIG. 7 is a plan view showing an outline of a substrate processing apparatus according to a fourth embodiment of the invention.

FIG. 7 is a schematic plan view of a substrate processing apparatus according to the fourth embodiment of the invention. Two sets of a liquid chemical jetting unit 70 and 80 are disposed over a substrate transport path 60. The liquid chemical jetting unit 70 has a plurality of nozzle support pipes 71 disposed in parallel to the transport direction 61 of the transport path 60. Nozzles 72 are mounted on each nozzle support pipe 71 at an equal interval. One end of each nozzle support pipe 71 is coupled via a swinging mechanism 74 to a liquid chemical supply pipe 73, and the other end of each nozzle support pipe 71 is rotatively supported by an end holding shaft 75.

Liquid chemicals are introduced into the liquid chemical supply pipe 73 and supplied via the swinging mechanism 74 to the nozzle support pipe 71. The liquid chemicals in the nozzle support pipe 71 are jetted out of the nozzles 72 and blown to the surface of a substrate transported along the transport path 60, while the swinging mechanism 74 swings the nozzle support pipe 71 about its center axis. The direction of flow of liquid chemicals jetted out of the nozzles changes in a virtual plane perpendicular to the transport direction 61, and the liquid chemical flow scans the surface of the substrate transported along the transport path 60, in the direction perpendicular to the transport direction 61. If the substrate surface is formed with grooves extending in the direction perpendicular to the transport direction 61, liquid chemicals can be efficiently blown to the bottom of each groove.

The liquid chemical jetting unit 80 is constituted of nozzle support pipes 81, nozzles 82, a liquid chemical supply pipe 83, swinging mechanisms 84, and an end holding shaft 85. This structure of the liquid chemical jetting unit 80 is the same as that of the liquid chemical jetting unit 70 rotated by 90° in the plane parallel to the transport path. As each liquid support shaft 81 is swinged, the direction of liquid chemicals jetted out of the nozzles 82 changes in a virtual plane parallel to the transport direction 61, and the liquid chemical flow scans the surface of the substrate transported along the transport path 60, in the direction parallel to the transport direction 61. If the substrate surface is formed with grooves extending in the direction parallel to the transport direction 61, liquid chemicals can be efficiently blown to the bottom of each groove.

A controller 90 detects the direction of striped ridge patterns formed on the surface of a substrate being transported along the substrate transport path 60. In accordance with the detection results, one of the liquid chemical jetting units 70 and 80 is selected and liquid chemicals are jetted out of the selected jetting unit under the control of the controller 90.

In this embodiment, two liquid chemical jetting units are provided and disposed so that liquid chemical flows jetted out of the jetting units scan the substrate surface in two perpendicular directions to each other. Accordingly, the substrate surface can be exposed reliably to liquid chemicals irrespective of whether the direction of striped ridge patterns on the substrate surface is parallel to or perpendicular to the transport direction.

The present invention has been described in connection with the preferred embodiments. The invention is not limited only to the above embodiments. It is apparent that various modifications, improvements, combinations, and the like can be made by those skilled in the art.

What is claimed is:

1. A substrate processing method comprising the steps of:
   (a) transporting a substrate along a transport path, the substrate having striped ridge patterns formed on a surface thereof;
   (b) setting an angle between a ridge-extension direction of the striped ridge patterns formed on the surface of the substrate and a jetting direction, as projected on the surface of the substrate, of fluid jetting out onto the substrate, the jetting direction being slanted in a direction other than normal to the substrate surface; and
   (c) jetting out the fluid onto the surface of the substrate along the jetting direction satisfying the angle set at said step (b) and processing the surface of the substrate,
   wherein said step (b) sets at least one of a rotational position of the substrate and the jetting direction of the fluid to make the angle smaller than 45°.

2. A substrate processing method according to claim 1, wherein:
   said step (b) includes a step of selecting at least one of at least two jetting units that jet out fluid in different directions; and
   said step (c) includes a step of jetting out the fluid from the selected jetting unit.

3. A substrate processing method according to claim 2, wherein:
   said step (c) further includes a step of temporarily suspending to transport the substrate and jetting out the fluid while moving the selected jetting unit along a virtual plane parallel to the surface of the substrate.

4. A substrate processing method according to claim 1, wherein:
   said step (b) includes a step of setting the jetting direction by controlling a jetting unit capable of variable jetting directions; and
   said step (c) includes a step of jetting out the fluid from said jetting unit set with the jetting direction.

5. A substrate processing method according to claim 1, wherein:
   said step (c) includes a step of exposing the surface of the substrate to the fluid by periodically reversing the transport direction of the substrate.

6. A substrate processing method comprising the steps of:
   (a) transporting a substrate along a transport path, the substrate having striped ridge patterns formed on a surface thereof;
   (b) setting an angle between a ridge-extension direction of the striped ridge patterns formed on the surface of the substrate and a jetting direction, as projected on the surface of the substrate, of fluid jetting out onto the substrate, the jetting direction being slanted in a direction other than normal to the substrate surface; and
   (c) jetting out the fluid onto the surface of the substrate along the jetting direction satisfying the angle set at said step (b) and processing the surface of the substrate, wherein said step (b) further includes a step of rotating the substrate to make the angle smaller than 45°.

7. A substrate processing method according to claim 6, wherein:

said step (c) includes a step of exposing the surface of the substrate to the fluid by periodically reversing the transport direction of the substrate.

8. A substrate processing method according to claim 1, wherein:

said step (b) includes a step of transporting the substrate to at least one of a first outflow transport path with a first jetting direction and a second outflow transport path with a second jetting direction different from the first jetting direction, based on the ridge-extension direction making the angle with at least one of the first and second jetting directions; and said step (c) processes the surface of the substrate by jetting out the fluid onto the surface of the substrate along at least one of the first and second outflow transport paths.

9. A substrate processing method according to claim 8, wherein:

said step (c) includes a step of exposing the surface of the substrate to the fluid by periodically reversing the transport direction of the substrate.

10. A substrate processing method comprising the steps of:

(a) transporting a substrate along a transport path, the substrate having striped ridge patterns formed on a surface thereof;

(b) determining a scanning direction for scanning the surface of the substrate relative to a ridge-extension direction of the striped ridge patterns; and (c) changing a jetting direction of fluid jetting out into the surface of the substrate, so that the fluid flows across the surface of the substrate in the scanning direction determined by said step (b).

11. A substrate processing method according to claim 10, wherein said step (b) determines as the scanning direction one of a direction parallel to the direction of transporting the substrate and a direction perpendicular to the direction of transporting the substrate.

12. A substrate processing method according to claim 1, wherein said fluid is gas.

13. A substrate processing method according to claim 1, wherein:

said substrate transported in said step (a) has liquid on the surface thereof; and in said step (b), the liquid on the surface of the substrate is blown away by the fluid jetted out and the surface is dried.

* * * * *